United States Patent
Welch

(10) Patent No.: US 11,798,946 B2
(45) Date of Patent: Oct. 24, 2023

(54) COMPACT FINFET CMOS

(71) Applicant: James D. Welch, Omaha, NE (US)

(72) Inventor: James D. Welch, Omaha, NE (US)

( * ) Notice: Subject to any disclaimer, the term of this patent is extended or adjusted under 35 U.S.C. 154(b) by 218 days.

(21) Appl. No.: 16/974,016

(22) Filed: Sep. 8, 2020

(65) Prior Publication Data
US 2021/0020637 A1    Jan. 21, 2021

(51) Int. Cl.
| H01L 27/092 | (2006.01) |
| H01L 21/8238 | (2006.01) |
| H01L 29/78 | (2006.01) |
| H01L 29/66 | (2006.01) |

(52) U.S. Cl.
CPC .. *H01L 27/0924* (2013.01); *H01L 21/823807* (2013.01); *H01L 21/823821* (2013.01); *H01L 29/66795* (2013.01); *H01L 29/7851* (2013.01)

(58) Field of Classification Search
CPC ......... H01L 27/0924; H01L 21/823807; H01L 21/823821; H01L 21/823871; H01L 29/66795; H01L 29/7851
See application file for complete search history.

(56) References Cited

U.S. PATENT DOCUMENTS

| 4,696,093 A | 9/1987 | Welch |
| 5,663,584 A | 9/1997 | Welch |
| 5,760,449 A | 6/1998 | Welch |
| 6,091,128 A * | 7/2000 | Welch ............... H01L 27/095 257/E27.068 |
| 6,268,636 B1 | 7/2001 | Welch |
| 6,413,802 B1 | 6/2002 | Hu et al. |
| 6,624,493 B1 | 9/2003 | Welch |
| 2019/0164966 A1 * | 5/2019 | Wang .............. H01L 21/823871 |
| 2020/0176448 A1 * | 6/2020 | Huang ............ H01L 21/823431 |

FOREIGN PATENT DOCUMENTS

WO    WO-2018095931 A2 *    5/2018    ......... H01L 29/0619

OTHER PUBLICATIONS

Fabrication of Sub-Micron Channel DMOST-Type, Mosfets By Ion-Implantation of Source, Brain and Channel, Welch, Is AST Transion Computers and Intellegent Systems, No. 2, vol. 3, 2011.

Mid-Bandaup Doped Junction, Single Semiconductor Type Device Equivalent to Conventional Dual Device (MOS, Welch, ISAST Transactions on Electronics and Signal Processing, No. 1, vol. 4 2010.

Insight To Operation of a Mid-Band gap Doped Junction, Single Semiconductor Type Device Alternative to Conventional Dual Device CMOS, welch, ISAST Transactions on Computers and Intelligent Systems, No. 1, vol. 3, 2010.

Migration of Ion-Implanted Krypton in Silicon During Anneal, Welch, Davies, Cobbold, J. App. Physics, vol. 48, No. 11, Nov. 1977.

* cited by examiner

*Primary Examiner* — Christine A Enad
(74) *Attorney, Agent, or Firm* — James D. Welch

(57) ABSTRACT

A Compact FINFET System including a material which forms rectifying junctions with both N or P-type Field Induced Semiconductor, including at least two FINS electrically connected thereto and projecting substantially away therefrom parallel to one another. There further being substantially non-rectifying junctions to the material which forms a rectifying junction with both N or P-type Field Induced Semiconductor, and distal ends of the at least two FINS.

6 Claims, 2 Drawing Sheets

ΔV' = PINCHOFF VOLTAGE DROP

ΔV" = SILICON CHANNEL VOLTAGE DROP

ΔV = ΔV' + ΔV" & IS "OFF" HALF SILICON CHANNEL CARRIER INDUCING GATE VOLTAGE

COMPACT FINFET CMOS

TECHNICAL FIELD

The present invention relates to CMOS technology, and more particularly to, in a preferred embodiment, a Compact FINFET CMOS System comprising a material which forms a rectifying junction with either N or P-type Field Induced Semiconductor.

BACKGROUND

CMOS systems are well established, with an improvement in recent years being FINFET geometry, which had its origin about 20 or so years ago as demonstrated by Hu et al., U.S. Pat. No. 6,413,802 which is incorporated hereinto by reference. "FIN" is terminology given to semiconductor projections from a planar surface of a semiconductor substrate as they resemble fins on fish. The geometry of the FIN allows for application of MOS Gate Electrodes not only above a Channel of a MOSFET formed in a substrate, but also to Sides of the effective 3D Structure. There are literally thousands of FINFET references now available, but none of which the Inventor is aware remotely disclose the present invention.

Continuing, Inventor Welch previously Patented the use of material which forms rectifying junctions with both N or P-type Silicon, whether the effective doping type is metallurgical or field induced. See U.S. Pat. Nos. 6,624,493; 5,663,584; 5,760,449; 6,091,128 and 6,268,636, (all of which are incorporated hereinto by reference). The listed Patents to Welch report work performed under a Grant from the US Dept. of Energy under Contract No. DE-FG47-93R701314, beginning in 1992. The work was performed in the 1990's and early 2000's at the University of Nebraska Electrical Engineering Dept. Another related Patent to Welch is U.S. Pat. No. 4,696,093, upon which the DOE Grant was initially based. In prior work, Inventor Welch had hands-on discovered that Chromium Disilicide was formed in Silicon by annealing Chromium (deposited via Electron beam or Sputtering onto Silicon) at about 600 degrees Centigrade, and said Chromium Disilicide forms rectifying junctions with either both N and P-type Silicon. Welch discovered that Chromium Disilicide formed a very good rectifying with N-type Silicon during his Masters work at Toronto in the early 70's when seeking to learn if Chromium deposited on $SiO_2$ migrated thereinto during a 600 degree C. anneal. (See "Migration of Ion-Implanted Krypton in Silicon During Anneal", Welch, Davies and Cobbold, J. Appl. Physics, Vol. 48, No. 11, November 1977) for discussion of migration properties of Amorphizing Krypton ions implanted into silicon at various doses and energies during anneal). That temperature was important as his DMOST-type fabrication process as that involved regrowth of an amorphized region at the surface of a substrate, into a single crystal thereby incorporating ion implanted Boron and Phosphorous dopants onto electrically active substitutional sites in a single anneal, and while the anneal was performed Chromium was present as a self-aligned atop an $SiO_2$ Gate Dielectric. To investigate Chromium migration in $SiO_2$ during anneal Welch applied Chromium to the back unpolished side of a substrate for electrical contact purposes, upon which, on the polished side thereof, was formed a MOS Capacitor. Comparing Capacitance before and after the 600 degree C. annealing resulted in the Capacitance decreasing when, if anything, an increased Capacitance was expected due to Oxide thinning caused by Chromium migration. The discovered effect was traced to the formation of a Capacitance providing rectifying junction on the rough unpolished backside of the substrate. (This was reported in his MASc. Thesis titled "Design and Fabrication of Sub-Micron Channel by Double Ion Implantation", MASC. Dissertation, University of Toronto, 1974. See also "Fabrication of Submicron Channel DMOST-Type MOSFTETS by Ion-Implantation of Source, Drain and Channel", ISAST Transactions on Computers and Intelligent Systems, No. 2, Vol. 3, 2011). Inventor Welch's MASc. hands-on research resulted in operational Sub-micron Channel length DMOST-type MOSFETS fabricated by ion-implantation techniques, rather than pre-deposition and drive-in diffusions. Literature searching in about 1984, soon after Inventor Welch had completed his Law Degree at the University of Nebraska and tested into the Patent and Nebraska State Bar, turned up an article by Lepselter and Sultanov titled "Some Properties of Chromium Doped Silicon", in Soviet Physics Semiconductors", Vol. 4, No. 11, Pages 1900-1902, May 1972 described the formation of a rectifying junction when Chromium is diffused into P-type Silicon. It was at that time Inventor Welch conceived using Chromium as a "dopant" in both N and P-type Silicon, to form a CMOS system and sought a Grant to investigate the effect. That effort eventually led to a Grant from the US Department of Energy (DOE).

A summary of the MASc. work, and the results of the work performed under the DOE Grant are presented in an unpublished proposed Ph.D. Thesis titled "Mid-Bandgap Doped Junction, Single Semiconductor Device Alternative to Conventional Dual Device CMOS, Fabrication Thereof, Operational Results, and Analysis". Said unpublished Thesis is available from Inventor Welch at jdwscmos1@netzero.net In addition two articles "Mid-Bandgap Doped Junction, Single Semiconductor Type Device Alternative to Conventional Dual Device CMOS", Welch, ISAST Transactions on Electronics and Signal Processing, No. 1, Vol. 4, 2010, and "Insight to Operation of a Mid-Bandgap Doped Junction Single Semiconductor Type Device Alternative to Conventional Dual Device CMOS", Welch, ISAST Transactions On Computers and Intelligent Systems, No. 1, Vol. 3, 2010), are also identified which report the same work.

Recently Inventor Welch studied FINFET systems, and in view thereof has conceived a simple approach to fabricating a compact FINFET CMOS System, which is disclosed herein. There remains need for CMOS systems that enable higher packing density of devices, and therefore prolong the validity of Moore's Law.

DISCLOSURE OF THE INVENTION

The present invention is a compact CMOS structure comprising a region of material in a semiconductor substrate which forms rectifying junctions with both field induced N and P-type semiconductor. The compact CMOS structure, in its preferred embodiment, further comprises at least two FINS projecting from electrical contact with said region of material in a semiconductor substrate which forms rectifying junctions with both field induced N and P-type semiconductor, said FINS being substantially parallel and adjacent to one another. Said compact FINFET CMOS structure further comprises a gate structure offset with respect to said FINS by insulating material. The compact FINFET CMOS structure further comprises substantially non-rectifying junctions to said material which forms rectifying junctions with both field induced N and P-type semiconductor, and to distal ends of said at least two FINS.

In use a voltage is applied between the substantially non-rectifying junctions to the distal ends of said at least two FINS and a voltage is applied to said gate which, when switched between the voltages applied to the substantially non-rectifying distal ends of said at least two FINS, causes a voltage to appear at the substantially non-rectifying junction to said region of material which forms rectifying junctions with both field induced N and P-type semiconductor which is inverted. That is, when the higher of said voltages applied to the substantially non-rectifying junctions to the distal ends of said at least two FINS is applied to said gate the voltage at the substantially non-rectifying junction to said region of material which forms rectifying junctions with both field induced N and P-type semiconductor is low, and vice-versa.

The at least two FINS can be made of silicon, and the region of material which forms rectifying junctions with both field induced N and P-type semiconductor is chromium disilicide.

The present invention system can be fabricated by a relatively simple method. Said method comprising the steps of:
  a) selecting a semiconductor substrate having at least one polished side;
  b) depositing or growing insulator on at least one polished surface thereof;
  c) etching openings through insulator regions where material that forms rectifying junctions with both N and P-type semiconductor is to be present;
  e) depositing material that forms rectifying junctions with both N and P-type semiconductor;
  f) optionally annealing or otherwise causing the deposited material that forms rectifying junctions with both N and P-type semiconductor to form rectifying junctions in the regions opened in step e);
  g) removing remaining material that forms rectifying junctions with both N and P-type semiconductor in all areas other than in the regions iopened in step e);
  h) opening areas in the insulator where ohmic contact to ends of channel regions are to be present;
  i) depositing a metal over the entire substrate;
  i) delineating the system such that said metal provides a multiplicity of gate regions over pairs of channels in the semiconductor, each pair of channels projecting from one of the region of material that forms rectifying junctions with both N and P-type semiconductor, and ending at separate ohmic contact region; while also delineating ohmic contacts with regions of said material that forms rectifying junctions with both N and P-type semiconductor;
  j) sintering said delineated system to form ohmic contacts at the ends of channels and with the regions of material that forms rectifying junctions with both N and P-type semiconductor Said method can provide that the substrate is silicon, the material that forms rectifying junctions with both N and P-type semiconductor in step e) is chromium which is annealed to produce chromium disilisde, and the metal deposited in step i) is aluminum. Additional steps can be incorporated to provide different gate threshold voltage adjusting materials are present, and/or to provide wall on sides of a gate etc.

Said method can comprise an additional step conducted between steps a) and b), said additional step comprising conducting a semiconductor etch that form a multiplicity of substantially parallel adjacent pairs of FINS, each of which projects from the polished surface of said substrate and the method is one of fabricating compact FINFET CMOS systems.

Note, in step b) it might be necessary to grow or deposit a fairly thick (eg. Microns) insulating layer and then thin it in the cannel regions, and/or in step i) designing the delineation masking to provide removal of Gate material other than where the channels are present. This could involve removing all insulator in the channel regions and again growing or depositing a thinner layer of insulator appropriate for use as a Gate insulator (eg. 1000 Angstroms). In particular, FIG. 2 should be viewed as a non-limiting example only. The important thing to take from FIG. 2 is that the Gate (G) affects both Channels (F1) (F2) similarly at once, as they are in close proximity. In conventional CMOS the N and P Channel devices the two Gates involved and are electrically accessed separately. Further, it is to be appreciated that the "channels referred to are simply regions in a substrate which become affected by a voltage applied to the gate. When the channel regions constitute FINS however, they are, of course, more easily defined by observable device geometry. Further, the language "substantially parallel", of course, includes the case where the channel regions are in fact actually parallel.

The invention will be better understood by reference the Detailed Description Section of this Specification, in conjunction with the Drawings.

DETAILED DESCRIPTION

Figure 1:
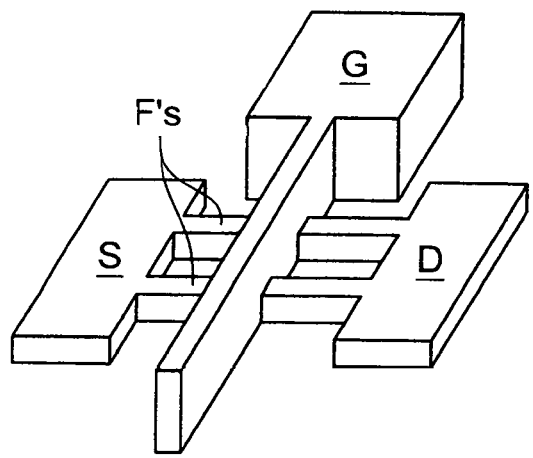
FIG. 1 shows a perspective view of a prior art FINFET.

FIG. 1 shows a perspective view of a prior art early depiction of a FINFET, adapted from U.S. Pat. No. 6,413,802.

Figure 2:
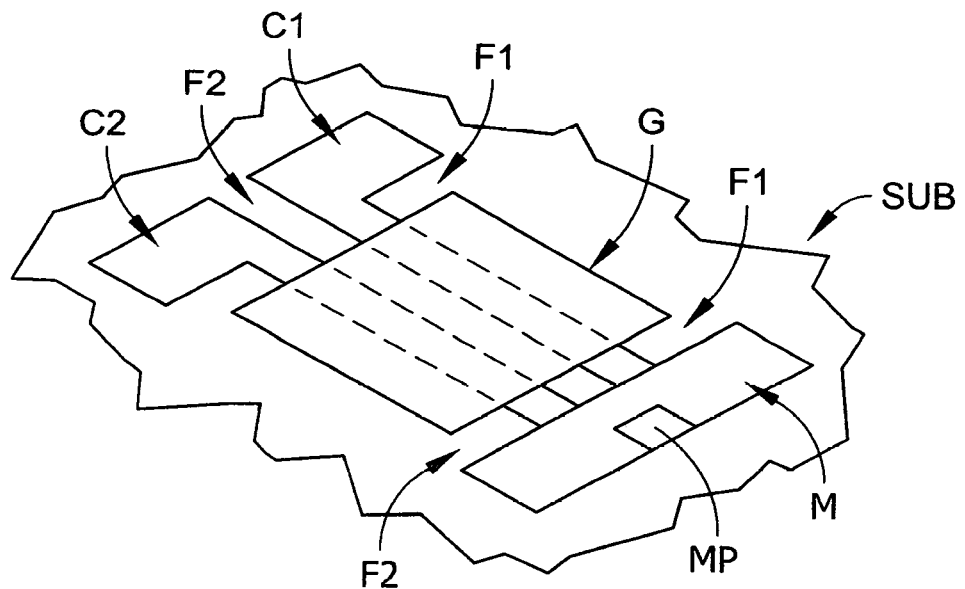
FIG. 2 shows a perspective view of a present invention Compact FINFET CMOS system.

FIG. 2 shows a perspective view of a present invention Compact FINFET CMOS system. Note the presence of a region of material (M) in a semiconductor substrate (SUB) which forms rectifying junctions with both field induced N and P-type semiconductor. The compact FINFET CMOS structure further comprises at least two FINS (F1) (F2) projecting from electrical contact with said region of material in a semiconductor substrate which forms rectifying junctions with both field induced N and P-type semiconductor (M), said FINS (F1) (F2) being substantially parallel and adjacent to one another to make the system as compact as possible. Said compact FINFET CMOS structure further comprises a gate (G) structure offset with respect to said FINS (F1) (F2) by insulating material (I) as shown better in FIG. 3. The compact FINFET CMOS structure further comprises substantially non-rectifying junctions (C1), (C2) and (MP) to said distal ends of said at least two FINS material (F1) (F2) and to the Material (M), respectively. It is to be understood that a region out from under the Gate that provides indication of FINS (F1) and (F2) FIG. 2 is not meant to imply that any distance must be present in a fabricated system, but is there only to allow indication (F1)

and (F2). In a preferred embodiment there is little such gap between the left and right side of the Gate (G) and the substantially non-rectifying junctions (C1) (C2) and (M).

Figure 3:
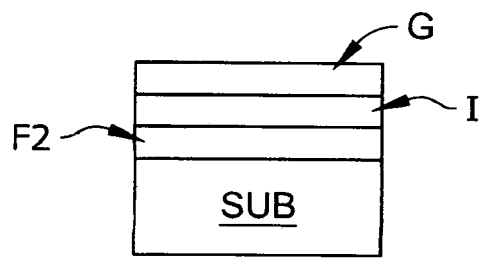
FIG. 3 is shows a front elevational view of the FIG. 2 system, showing the Insulator (I) between the Gate (G) and FIN (F2).

FIG. 3 is included to as a front elevational view of the FIG. 2 system, showing the Insulator (I) between the Gate (G) and FIN (F2). Note that the Gate (G) can be a metal or a composite of metal and non-metal components. Further, the Insulator under the Gate (G) can be much thinner than at other locations, and/or the Gate (G) can be of a nature that is present only above a Channel Region (F1) (F2), as FIG. 2 can be interpreted to show, or it can be present on one of both sides and above a FIN Channel region in a semiconductor substrate, as shown in FIG. 1. The later point is not a determining factor as regards Patentability. That, it is believed is found in the unique combination teachings regarding application of material in a semiconductor substrate which forms rectifying junctions with both field induced N and P-type semiconductor in the identified Patents by Welch, which teaching have not previously been applied to FINFET systems comprising parallel adjacent channels (F1) (F2), and in the many FINFET related Patents, such as U.S. Pat. No. 6,413,802 to Hu et al. Inventor Welch has combined elements, each arguably present in various prior art publications, in a novel way he was positioned to appreciate resulting from a chance discovery in his Masters work that Chromium annealed to N-type Silicon formed a very good rectifying junction, in combination with discovery of the previously mentioned Lepselter and Sultanov article which reported Chromium did likewise with P-type Silicon, all in combination with recently developed insight to the FINFET structure which naturally lends itself to providing substantially parallel and adjacent Channel regions (F1) (F2) which can both be conveniently subject to a single Gate (G) voltage in use. MOSFET structures that are formed from sequential N and P-Channel devices in N and P doped regions on a substrate must use a split gate as did the results Welch reported in his previous Patents. The present invention, again, does not require space consuming alternating N and P-type regions in a substrate, but rather uses only a single Intrinsic or Compensated substrate and positions Channels substantially parallel and adjacent to one another to achieve a Compact end result.

Figure 4:
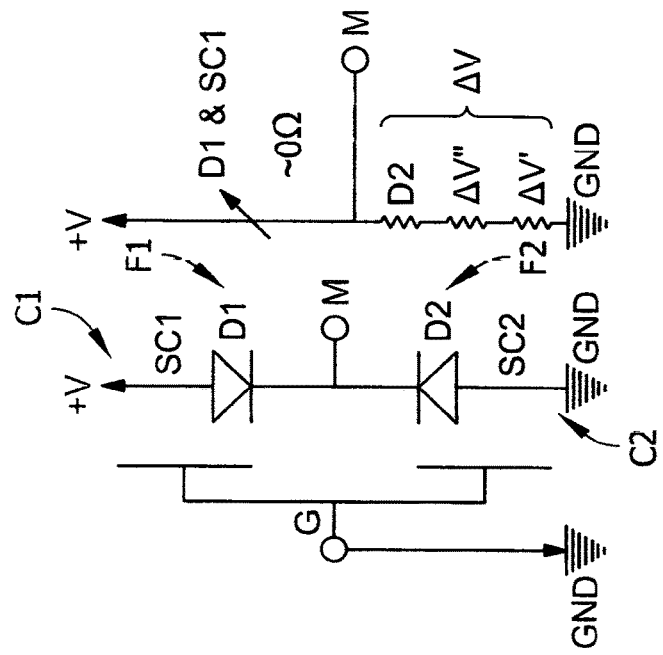
FIGS. 4 and 5 are adapted from Patent to Welch, U.S. Pat. No. 6,624,493 and serve to indicate the Inverting Nature of the present invention.
Figure 5:
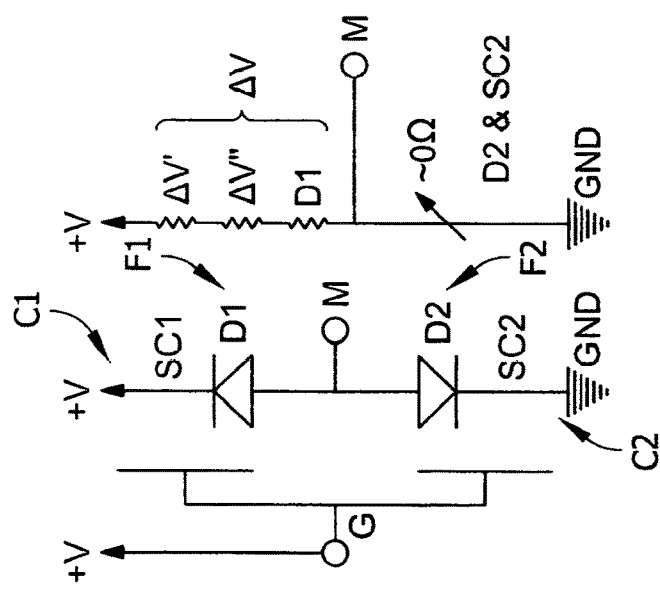

FIGS. 4 and 5 are adapted from Patent to Welch, U.S. Pat. No. 6,624,493, amongst other publications by Welch, and serve to indicate the Inverting Nature of the present invention. Said Figs. show an exemplary biasing situation wherein a Positive Voltage is applied to (C1), and (C2) is Grounded. The Ground could just as well be a Negative Voltage and therefore FIGS. 4 and 5 are not limiting. Note that when the Gate (G) Voltage is at +V in FIG. 4, the Midpoint (MP) of the present Compact FINFET CMOS system is at Ground (GND). FIG. 5 shows that when the Gate (G) Voltage is at Ground (GND), the Midpoint (MP) of the present Compact FINFET CMOS system is at +V, thus Inversion occurs. As perhaps better described in the previously mentioned unpublished Thesis by Welch, it should be appreciated that the same Gate voltage is applied to Gates (G) in both Channel Regions (F1) and (F2). When the Gate Voltage is High at +V, electrons are attracted into both Cannels (F1) and (F2), which makes the Lower junction D2 Forward Biased, and when Gate Voltage is Low at Ground (or a negative value) Holes are pulled into both Channel Regions (F1) and (F2) the Upper junction (D1) is Forward-biased. In the First Case the voltage appearing at the Midpoint (MP) is Low and in the Second Cases the midpoint (MP) Voltage is high, thus Inversion is accomplished. It is also noted that an Off Side will present barriers to Conduction as a result of at least two sources. First a Channel Pinchoff Voltage ($\Delta V'$), and Second a Channel Resistance ($\Delta V''$) will be present.

It is noted that in Inventor Welch's earlier Single Device CMOS fabrication work under the previously mentioned DOE Grant, the two device channels (equivalent to the two FINS (F1) and (F2) were sequential, hence the Gate was split and the resulting S-CMOS devices were not very compact, much as is the case with conventional P-N Junction based CMOS systems. In the present Compact FINFET CMOS system however, the substantially parallel and adjacent FINS (Channels) (F1) and (F2) are present adjacent to one another, and operated from a single Gate (G) structure. This is why the present FINFET system is compact. The present Device Configuration is not, to the Inventor's knowledge, remotely suggested in any prior art. It was only because of Inventor Welch's prior experience that the Present Invention conceived. Note as well that no N and P-type wells are necessary to fabricate P and N Channel MOSFETS as now Claimed. Inventor Welch did his earlier DOE sponsored fabrication of Single Device CMOS on Intrinsic Silicon, (see his U.S. Pat. Nos. 6,624,493; 5,663,584; 5,760, 449; 6,091,128 and 6,286,636) and the previously mentioned Unpublished Thesis, but it is thought that use of Compensated Semiconductor might provide benefit, though there was not time to try that prior work. This lack of the need for space consuming N and P-doped wells is another factor that enables the present system to be compact, and makes the present invention less energy intensive to realize. For emphasis, the major factor enabling the present invention is that some materials (M) form rectifying junctions with either N or P-type filed induced effective doping n a Channel region of a MOSFET. FIGS. 4 and 5 demonstrate the benefit that provides. A further consideration is that P-N junctions involve space-charge regions which limit how small a channel can be without punch-through occurring. This is not a problem where the junctions are hot carrier type as in the present invention. It is believed Patentability attaches to the Present Invention as it overcomes many problems associated with previously known CMOS structures, while importantly, providing a very compact system via placement of channels adjacent to one another both of which are influenced by a single Gate (G).

Finally, the present invention in FIG. 2 can be viewed as a prior art FIG. 1 system in which the Drain (D) is replaced with a region of material (M) that forms rectifying junctions with both field induced N and P-type semiconductor, and the Gate (G) is expanded to cover more of the FIG. 1 FIN Channels (F's). Nothing in Hu et al. '802 or any other known reference remotely suggests that. Further nothing in Hu et al. '802 remotely suggests that one skilled in the art of FINFET systems should seek out material that forms rectifying junctions with both field induced N and P-type semiconductor. It is only because of Inventor Welch's experience and insight in the area that he conceived the present invention. Further, Inventor Welch has found that his idea of using material that forms rectifying junctions with both field induced N and P-type semiconductor seems not to have been generally appreciated by people involved in solid state device design. A Professor at Illinois University for instance, when asked by the Government to evaluate his work based on his first Patent in the area—thoroughly trashed it. When Inventor Welch phoned that Professor and walked him through it, he commented that he had completely missed the invention—and that Welch had performed Ph.D. level research. No further funding developed, however.

Having hereby disclosed the subject matter of the present invention, it should be obvious that many modifications, substitutions and variations of the present invention are possible in view of the teachings. It is therefore to be understood that the invention may be practiced other than as specifically described, and should be limited only in its breadth and scope only by the Claims.

I claim:

1. A compact CMOS structure comprising a region of material in a semiconductor substrate, said region of said semiconductor substrate not requiring the presence of N and P-type wells, which material forms rectifying junctions with both field induced N and P-type semiconductor, said compact CMOS structure further comprising at least two channels projecting from electrical contact with said region of material in a semiconductor substrate which forms rectifying junctions with both field induced N and P-type semiconductor, said channels being substantially parallel and adjacent to one another;

said compact CMOS structure further comprising a gate structure offset with respect to said channels by insulating material;

said compact CMOS structure further comprising substantially non-rectifying junctions to said material which forms rectifying junctions with both field induced N and P-type semiconductor, and to distal ends of said at least two channels;

such that in use a voltage is applied between the substantially non-rectifying junctions at the distal ends of said at least two channels and a voltage is applied to said gate which, when switched between the voltages applied to the substantially non-rectifying distal ends of said at least two channels, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said at least two channels is applied to said gate, the voltage at the substantially non-rectifying junction to said region of material which forms rectifying junctions with both field induced N and P-type semiconductor is low, and vice-versa.

2. A compact CMOS structure as in claim 1, wherein the at least two channels are silicon, and the region of material which forms rectifying junctions with both field induced N and P-type semiconductor is chromium disilicide.

3. A compact CMOS structure as in claim 1, in which the gate is a composite of metal and non-metal components.

4. A compact FINFET CMOS structure comprising a region of material in a semiconductor substrate, said region of said semiconductor substrate not requiring the presence of N and P-type wells, which material forms rectifying junctions with both field induced N and P-type semiconductor, said compact CMOS structure further comprising at least two FIN channels projecting from electrical contact with said region of material in a semiconductor substrate which forms rectifying junctions with both field induced N and P-type semiconductor, said FIN channels being substantially parallel and adjacent to one another;

said compact FINFET CMOS structure further comprising a gate structure offset with respect to said FIN channels by insulating material;

said compact FINFET CMOS structure further comprising substantially non-rectifying junctions to said material which forms rectifying junctions with both field induced N and P-type semiconductor, and to distal ends of said at least two FIN channels;

such that in use a voltage is applied between the substantially non-rectifying junctions at the distal ends of said at least two FIN channels and a voltage is applied to said gate which, when switched between the voltages applied to the substantially non-rectifying distal ends of said at least two FIN channels, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said at least two FIN channels is applied to said gate, the voltage at the substantially non-rectifying junction to said region of material which forms rectifying junctions with both field induced N and P-type semiconductor is low, and vice-versa.

5. A compact CMOS structure comprising a region of material in a semiconductor substrate, said region of said semiconductor substrate not requiring the presence of N and P-type wells, which material forms rectifying junctions with both field induced N and P-type semiconductor, said compact CMOS structure further comprising at least two channels or fins projecting from electrical contact with said region of material in a semiconductor substrate which forms rectifying junctions with both field induced N and P-type semiconductor, said channels or fins being substantially parallel and adjacent to one another;

said compact CMOS structure further comprising a gate structure offset with respect to said channels or fins by insulating material;

said compact CMOS structure further comprising substantially non-rectifying junctions to said material which forms rectifying junctions with both field induced N and P-type semiconductor, and to distal ends of said at least two channels or fins;

such that in use a voltage is applied between the substantially non-rectifying junctions at the distal ends of said at least two channels or fins and a voltage is applied to said gate which, when switched between the voltages applied to the substantially non-rectifying distal ends of said at least two channels or fins, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said at least two channels or fins is applied to said gate, the voltage at the substantially non-rectifying junction to said region of material which forms rectifying, junctions with both field induced N and P-type semiconductor is low, and vice-versa wherein the at least two channels or fins are silicon, and the region of material which forms rectifying junctions with both field induced N and P-type semiconductor is chromium disilicide.

6. A compact CMOS structure formed in a semiconductor substrate by:

a) selecting a semiconductor substrate, identifying insulating material, and identifying material that forms rectifying junctions with both N and P-type field induced doping in said semiconductor substrate when present in said semiconductor substrate;

b) fashioning said semiconductor substrate, said insulating material and said material that forms rectifying junctions with both N and P-type field induced doping when said material is present in said semiconductor substrate, to comprise said compact CMOS structure;

said compact CMOS structure being characterized by further comprising two channels projecting from electrical contact with said region of material that forms rectifying junctions with both N and P-type field induced doping in said semiconductor substrate, wherein said channels are substantially parallel and adjacent to one another;

said compact CMOS structure further comprising a gate structure offset with respect to said channels by said insulating material; and said compact CMOS structure further comprising substantially non-rectifying junctions to said material which forms rectifying junctions with both field induced N and P-type semiconductor, and to distal ends of said two channels;

such that in use a voltage is applied between the substantially non-rectifying junctions at the distal ends of said two channels and a voltage is applied to said gate which, when switched between the voltages applied to the substantially non-rectifying distal ends of said two channels, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said two channels is applied to said gate, the voltage at the substantially non-rectifying junction to said region of material which forms rectifying junctions with both field induced N and P-type semiconductor is low, and vice-versa.

* * * * *